United States Patent
Song et al.

(10) Patent No.: US 11,497,127 B2
(45) Date of Patent: Nov. 8, 2022

(54) FLEXIBLE DISPLAY DEVICE AND METHOD FOR FABRICATING REAR COVER GLASS

(71) Applicant: LG ELECTRONICS INC., Seoul (KR)

(72) Inventors: Insu Song, Seoul (KR); Insun Lee, Seoul (KR); Sunggab Kim, Seoul (KR); Seungyeop Song, Seoul (KR); Minsoo Kim, Seoul (KR); Seongcheol Lee, Seoul (KR)

(73) Assignee: LG ELECTRONICS INC., Seoul (KR)

(*) Notice: Subject to any disclaimer, the term of this patent is extended or adjusted under 35 U.S.C. 154(b) by 101 days.

(21) Appl. No.: 17/002,626

(22) Filed: Aug. 25, 2020

(65) Prior Publication Data
US 2021/0368634 A1 Nov. 25, 2021

(30) Foreign Application Priority Data
May 25, 2020 (WO) .............. PCT/KR2020/006740

(51) Int. Cl.
H05K 7/02 (2006.01)
H05K 7/04 (2006.01)
H05K 5/00 (2006.01)
H05K 5/03 (2006.01)
G02B 5/00 (2006.01)
(Continued)

(52) U.S. Cl.
CPC .......... *H05K 5/0017* (2013.01); *G02B 5/003* (2013.01); *G02B 5/0284* (2013.01); *H05K 5/0217* (2013.01); *H05K 5/03* (2013.01)

(58) Field of Classification Search
USPC ................................ 361/728, 807, 809, 810
See application file for complete search history.

(56) References Cited

U.S. PATENT DOCUMENTS 10,088,863 B2 * 10/2018 Rappoport ............... F21K 9/20
10,938,970 B1 *  3/2021 Lee ..................... H04M 1/0237
(Continued)

FOREIGN PATENT DOCUMENTS

KR  20110095820  8/2011
KR  20160087460  7/2016
(Continued)

OTHER PUBLICATIONS

PCT International Application No. PCT/KR2020/006740, International Search Report dated Feb. 18, 2021, 11 pages.

*Primary Examiner* — Hung S. Bui
(74) *Attorney, Agent, or Firm* — Lee, Hong, Degerman, Kang & Waimey PC

(57) ABSTRACT

The present disclosure relates to a method for fabricating a rear cover glass and a flexible display device including a first body, a second body configured to be movable relative to the first body, a flexible display disposed on a front surface of the first body and a rear surface of the second body and configured such that a size of an area exposed to the front surface of the first body and a size of an area exposed to the rear surface of the second body vary as the first body and the second body are moved relative to each other, and a rear cover glass mounted on the second body and disposed to cover at least a part of the rear surface of the second body.

8 Claims, 9 Drawing Sheets

(a)

(b)

(51) Int. Cl.
*G02B 5/02* (2006.01)
*H05K 5/02* (2006.01)

(56) References Cited

U.S. PATENT DOCUMENTS

| | | | | |
|---|---|---|---|---|
| 2016/0081204 A1* | 3/2016 | Park | .................... | H04M 1/0268 |
| | | | | 361/807 |
| 2016/0306468 A1* | 10/2016 | Chen | ..................... | H01L 27/323 |
| 2018/0102072 A1* | 4/2018 | Lee | ........................ | G09F 9/301 |
| 2019/0268455 A1* | 8/2019 | Baek | .................... | H04M 1/0237 |
| 2021/0120111 A1* | 4/2021 | Choi | ..................... | G06F 1/1624 |

FOREIGN PATENT DOCUMENTS

| | | |
|---|---|---|
| KR | 20190089374 | 7/2019 |
| KR | 102051313 | 12/2019 |
| KR | 20200054674 | 5/2020 |

* cited by examiner (a)

(b)

(a)

(b)

(a)

(b)

(a)

(b)

FLEXIBLE DISPLAY DEVICE AND METHOD FOR FABRICATING REAR COVER GLASS

CROSS-REFERENCE TO RELATED APPLICATION

Pursuant to 35 U.S.C. § 119(a), this application claims the benefit of an earlier filing date and right of priority to International Application No. PCT/KR2020/006740 filed on May 25, 2020, the contents of which are hereby incorporated by reference herein in its entirety.

BACKGROUND

1. Technical Field

The present disclosure relates to a flexible display device and a method for fabricating a rear cover glass capable of reflecting and absorbing light.

2. Description of the Related Art

A portable electronic device (hereinafter, a mobile terminal) such as a communication terminal, a multimedia device, a portable computer, a game player, and a photographing device is provided with a display to display image information. A mobile terminal may also have a folding structure that can be folded into a smaller size for convenience of portability. In this type of electronic device, two bodies are connected by a folding structure (e.g., a hinge portion).

Since the related art display had a non-foldable structure, a structure in which a display is disposed over foldably connected two bodies could not be implemented. Therefore, a large screen could not actually be applied to an electronic device with a folding structure.

However, as a flexible display capable of bending has been developed recently, researches to apply a flexible display to a mobile terminal are being conducted, and thus, it is possible to implement a large screen on a device.

Such a flexible display device may realize various sizes of screen by using deformable characteristics of the flexible display. For example, a flexible display device that can be extended to a screen size desired by a user by allowing the flexible display to be drawn out of the device body to extend an area exposed outside may be considered.

Therefore, a flexible display device that proposes a mechanism in which a screen can be exposed to a front surface and a rear surface of a frame, respectively, and provides smooth movement of a flexible display to implement various states may be considered.

However, among various states, as a region of the flexible display disposed on the rear surface of the flexible display device moves to the front surface, it is necessary to consider a method for reducing of showing internal components on the rear surface of the flexible display device.

SUMMARY

A first aspect of the present disclosure is to provide a flexible display device capable of reducing showing of an inner portion of a body through a rear surface of the body, even when a flexible display moves to a front surface of the flexible display device.

A second aspect of the present disclosure is to provide a method for fabricating a rear cover glass at a low cost while achieving a high yield and reducing a fabrication time.

A third aspect of the present disclosure is to provide a flexible display device including a rear cover glass excellent in both reliability and optical characteristics.

To achieve the above aspect and other advantages of the present disclosure, there is provided a flexible display device including a first body, a second body configured to be movable relative to the first body, a flexible display disposed on a front surface of the first body and a rear surface of the second body and configured such that a size of an area exposed to the front surface of the first body and a size of an area exposed to the rear surface of the second body vary as the first body and the second body are relatively moved, and a rear cover glass mounted on the second body and disposed to cover at least a part of the rear surface of the second body.

As another example, the flexible display may be configured to implement a first state in which the first body and the second body are located adjacent to each other such that an area exposed to the rear surface of the second body increases, and a second state in which the first body and the second body move away from each other such that an area exposed to the front surface of the first body increases.

As another example, the rear cover glass may be configured to cover the flexible display disposed on the rear surface of the second body in the first state, and to cover an inner portion of the second body disposed on an inner surface of the second body in the second state.

As another example, the rear cover glass may include a high-reflective layer configured to transmit light from the flexible display when power is applied to the flexible display in the first state, and to reflect light introduced from outside to reduce showing of the inner portion of the second body in the second state.

As another example, the high-reflective layer may include titanium dioxide ($TiO_2$), silicon dioxide ($SiO_2$) and metal oxide (MOx).

As another example, the rear cover glass may include a cover glass located on an outermost portion, a high-reflective layer disposed below the cover glass and reflecting light introduced from outside, and a low-reflective layer disposed below the high-reflective layer and absorbing light that is introduced from outside and passed through the high-reflective layer.

As another example, the rear cover glass may further include an adhesive layer disposed on at least one place between the cover glass and the high-reflective layer or between the high-reflective layer and the low-reflective layer.

As another example, the rear cover glass may further include a Poly Ethylene Terephthalate (PET) film disposed above or below the high-reflective layer.

As another example, the low-reflective layer may be formed thinner than the adhesive layer and the PET film, and the high-reflective layer may be formed thinner than the low-reflective layer.

As another example, the second body may be bent at an end portion thereof, and the rear cover glass may be bent at an end portion thereof along the bent end portion of the second body.

In a method for fabricating a rear cover glass that is disposed on a rear surface of a second body of a flexible display device including a first body, the second body configured to be movable relative to the first body, and a flexible display, the method includes depositing a high-reflective layer on a PET film, adhering a low-reflective layer on the PET film on which the high-reflective layer is deposited, and coating an adhesive layer on the PET film on which the low-reflective layer is adhered.

As another example, a surface on which the high-reflective layer is deposited on the PET film and a surface on which the low-reflective layer is adhered to the PET film may be opposite to each other.

As another example, the method may further include printing a bezel area, after coating the adhesive layer.

The effects of the present disclosure to be obtained by the above-described solutions are as follows.

In the rear cover glass, light from the flexible display passes through the high-reflective layer in the first state and is visible from outside. And, light introduced into the rear surface of the second body in the second state is reflected by the high-reflective layer. Therefore, even if the flexible display is not disposed on the rear surface of the second body according to an arrangement state of the flexible display device, showing of the inner portion of the rear surface of the second body can be reduced.

Since the high-reflective layer includes titanium dioxide (TiO2), silicon dioxide (SiO2), and metal oxide (MOx), which have high scattering properties against light, and absorbs light from outside, or reflects and scatters light, showing of the inner portion of the second body can be reduced, and therefore, a beautiful appearance can be achieved.

By adopting a roll-to-roll method or a film laminator method as a method for fabricating the rear cover glass, there is an advantage of achieving a high yield at least twice higher than that of a direct deposition or printing method. Accordingly, the rear cover glass can be fabricated at a low cost. Furthermore, a fabrication time can be greatly reduced compared to the direct deposition or printing.

And, by adopting specific thicknesses in the adhesive layer and the PET film in a multi-layer structure, there can be provided a rear cover glass that excellently satisfies both reliability and optical properties with a highest peel strength, transmittance, and reflectance.

Figure 2:
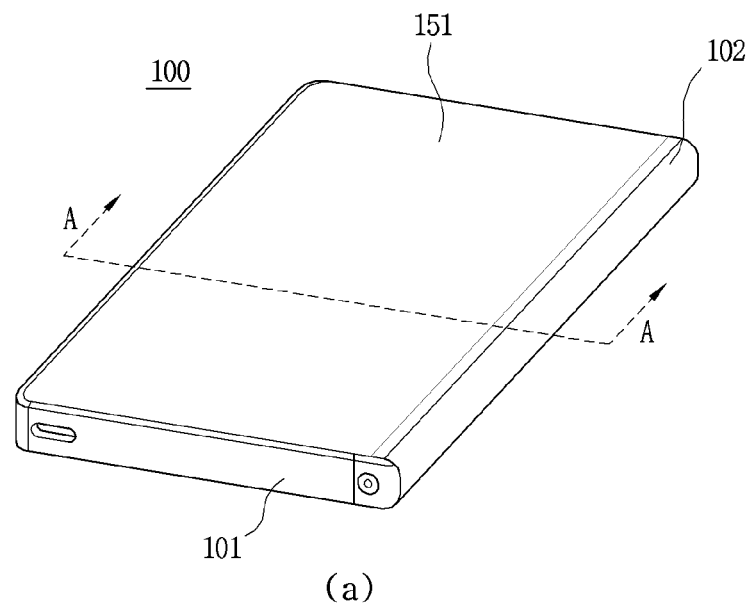
Figure 2:
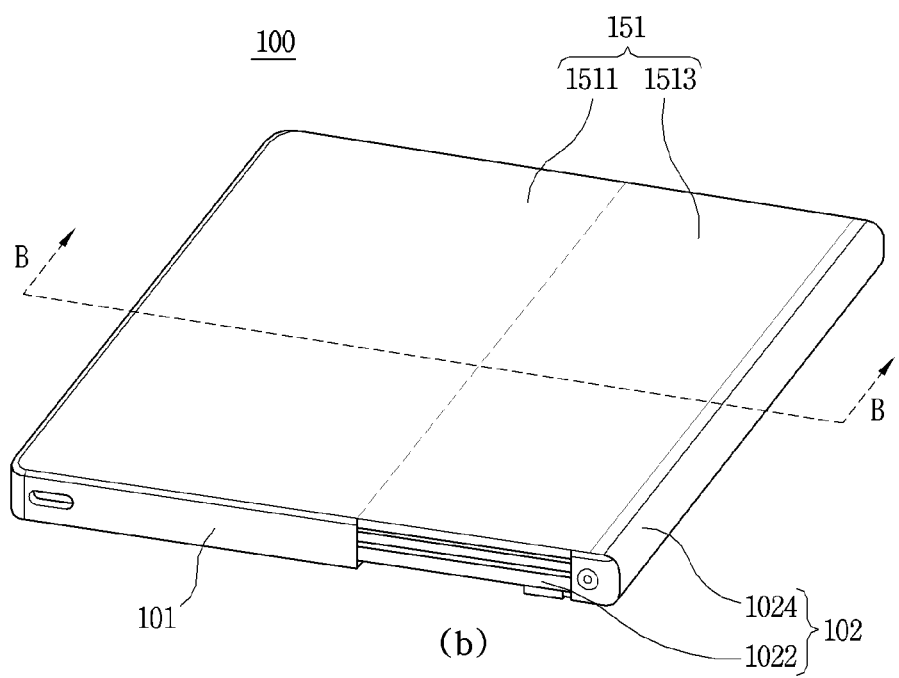

(a) and (b) of FIG. 2 are perspective views illustrating an exterior appearance of a front surface of a flexible display device in a first state and in a second state, respectively.

Figure 3:
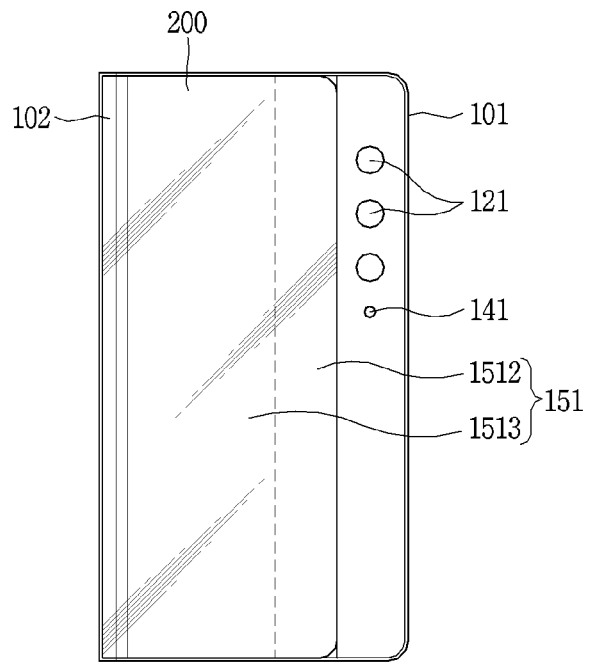
Figure 3:
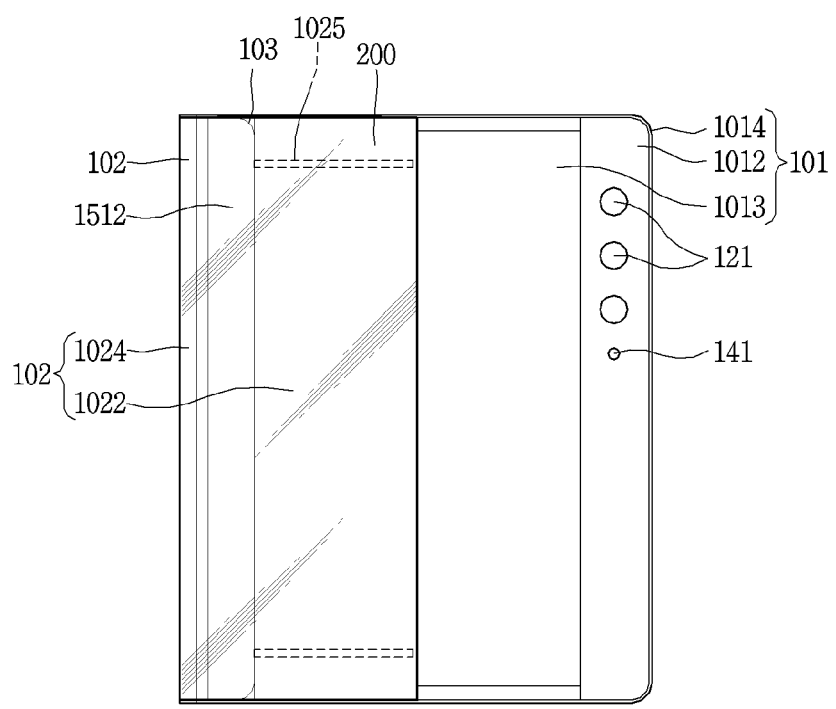

(a) and (b) of FIG. 3 are perspective views illustrating an exterior appearance of a rear surface of the flexible display device in the first state and in the second state, respectively.

Figure 4:
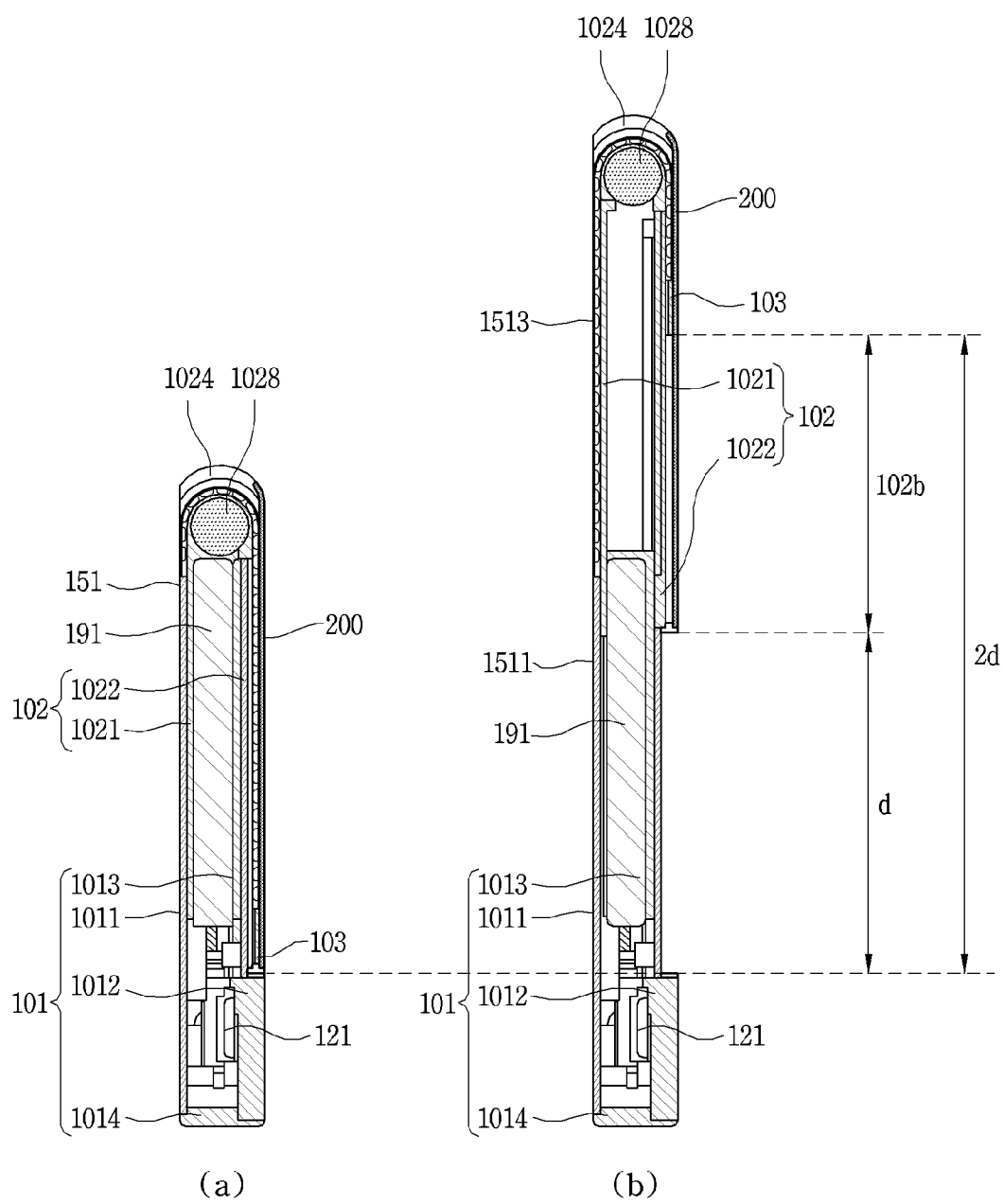

(a) of FIG. 4 is a cross-sectional view taken along a line A-A in (a) of FIG. 2, and (b) of FIG. 4 is a cross-sectional view taken along a line B-B in (b) of FIG. 2.

Figure 5:
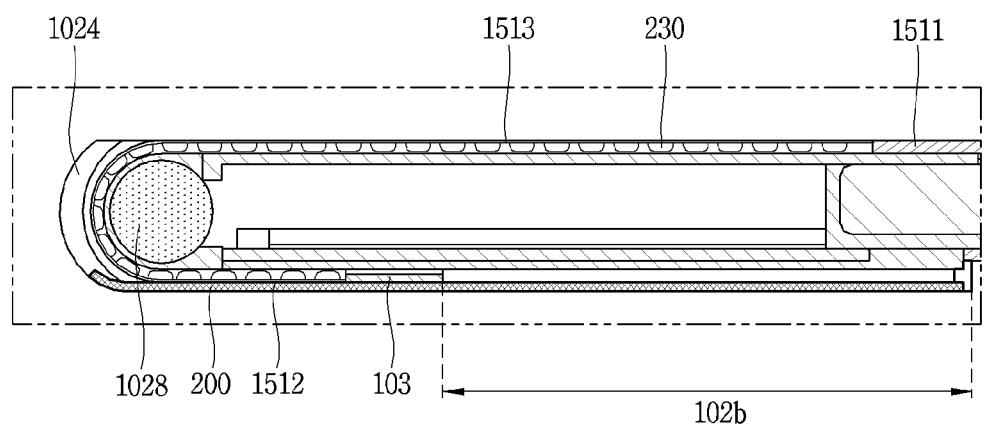

FIG. 5 is a partial cross-sectional view illustrating (b) of FIG. 4 enlarged.

Figure 6:
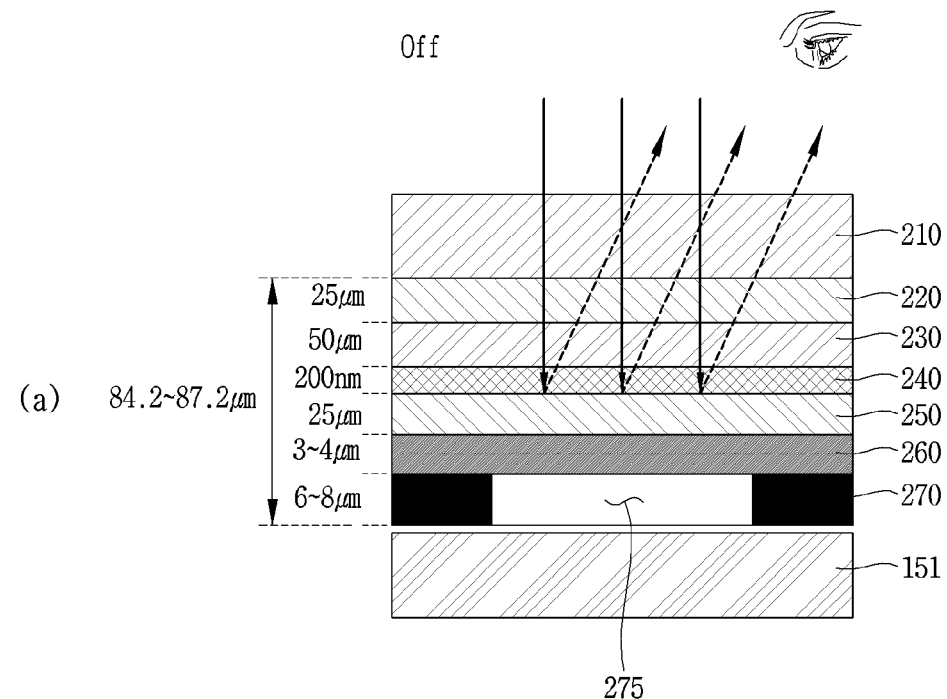
Figure 6:
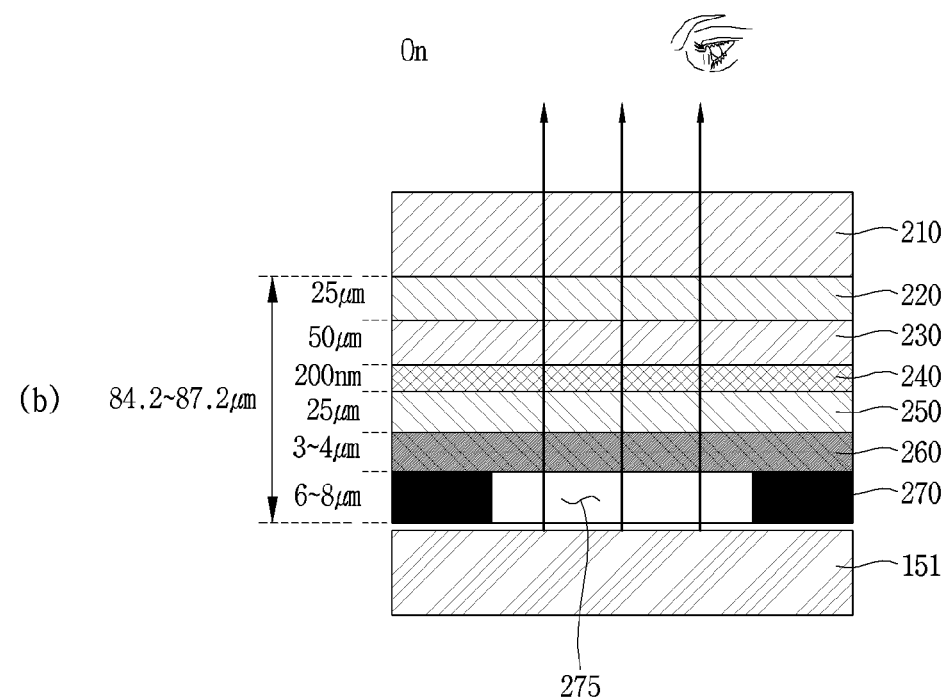

FIG. 6 is a view illustrating a rear cover glass according to an embodiment of the present disclosure.

Figure 7:
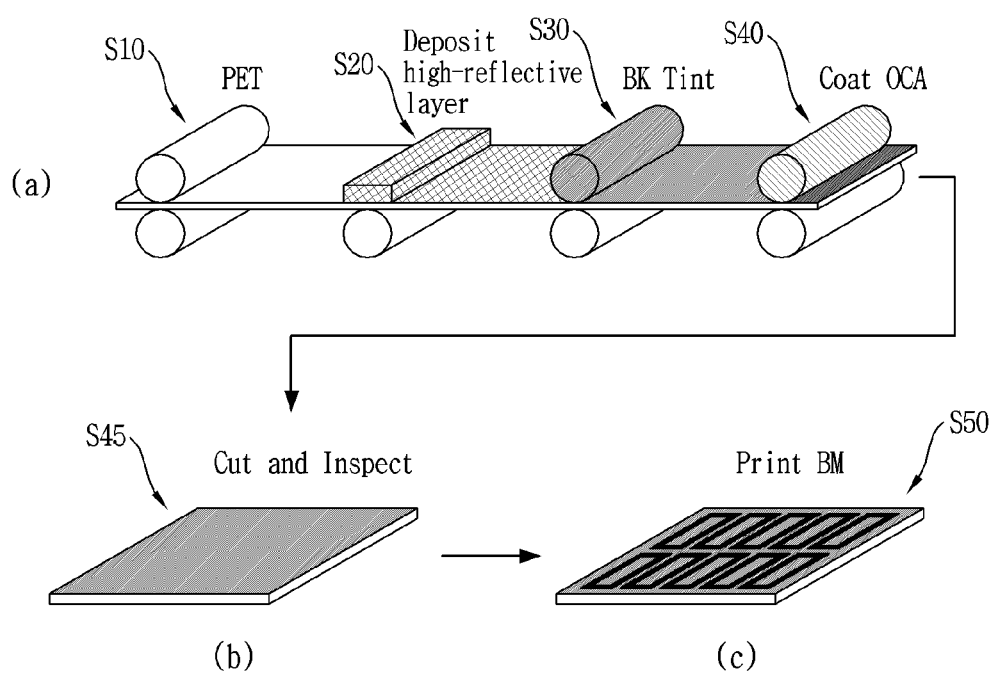

FIG. 7 is a conceptual view illustrating a method for fabricating a rear cover glass according to an embodiment of the present disclosure.

Figure 8:
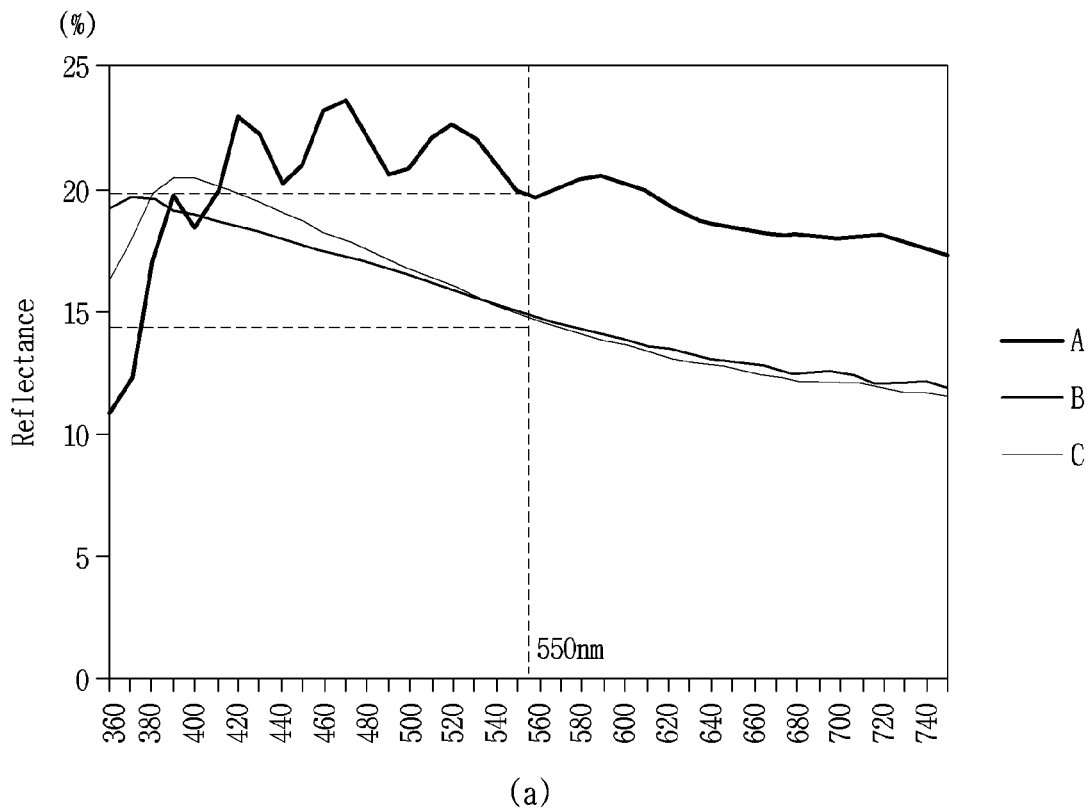
Figure 8:
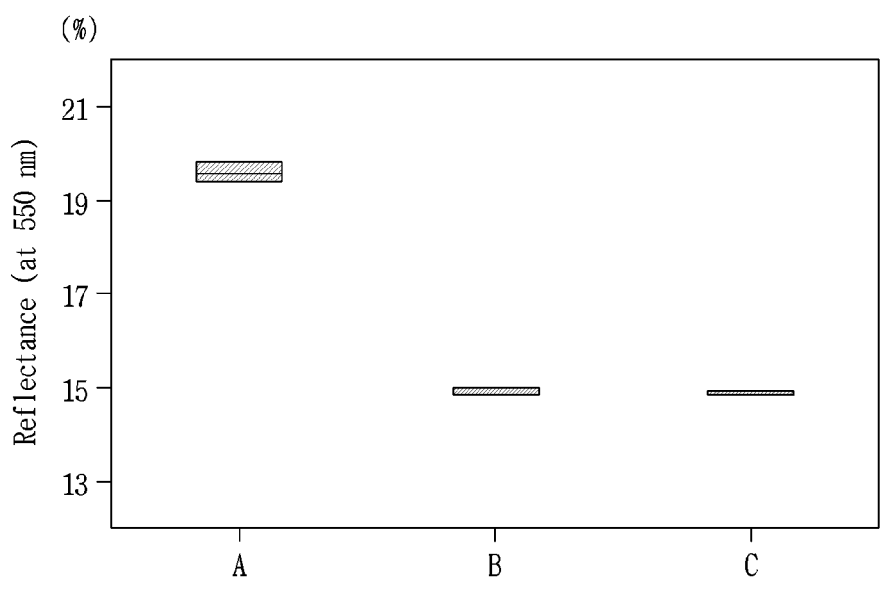
Figure 9:
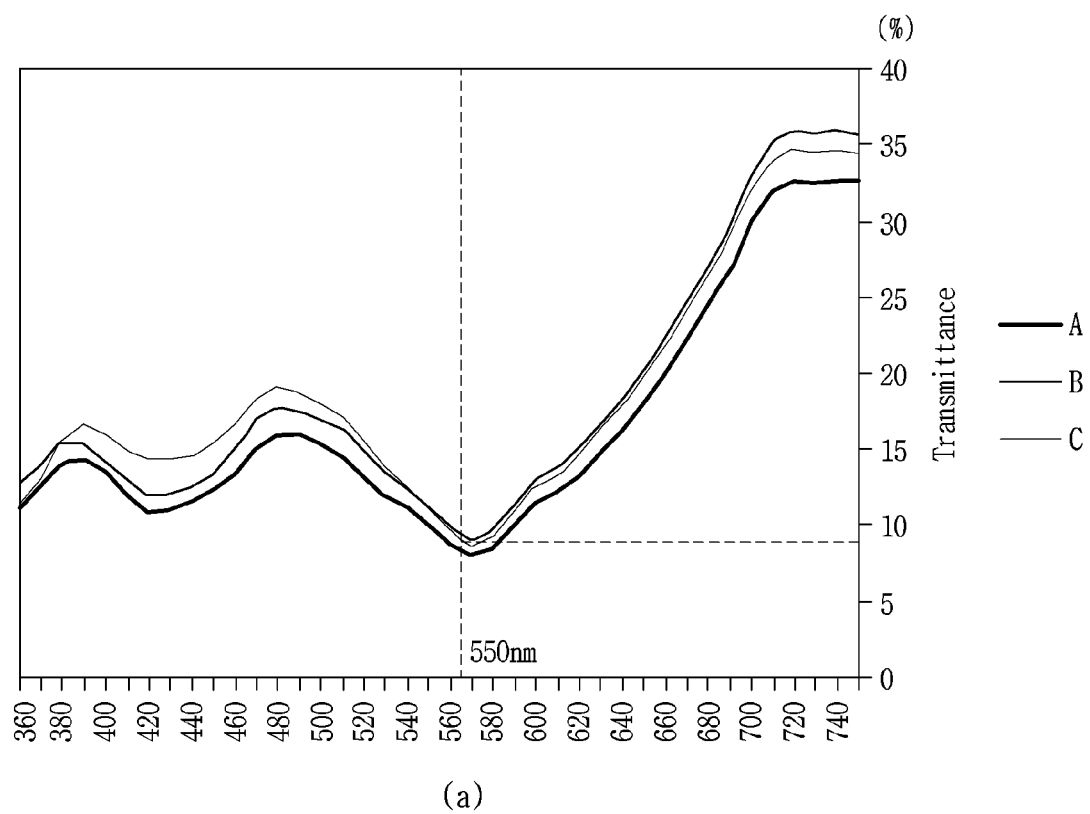
Figure 9:
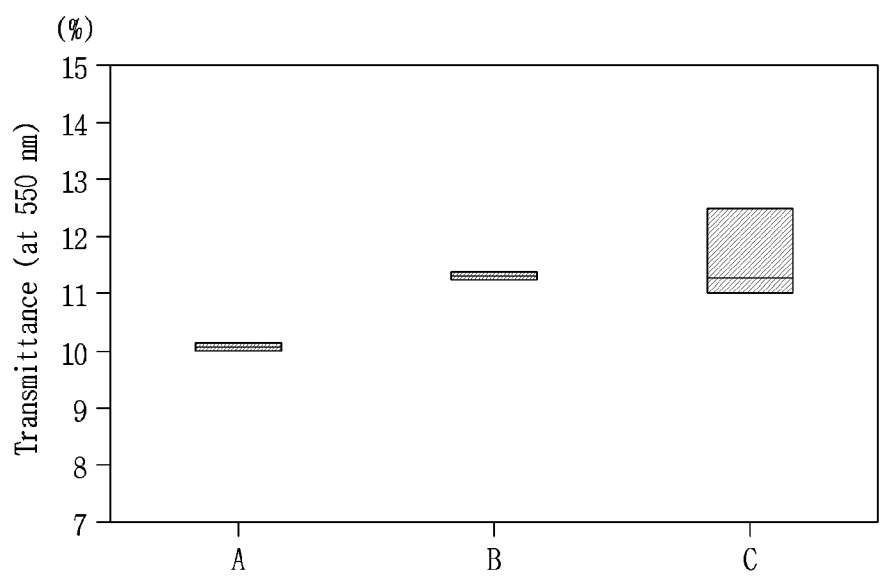

FIGS. 8 and 9 are graphs and diagrams showing reflectance and transmittance of a plurality of rear cover glasses having different thicknesses according to an embodiment of the present disclosure at different wavelengths.

DETAILED DESCRIPTION OF THE PREFERRED EMBODIMENT

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In describing the present disclosure, if a detailed explanation for a related known function or construction is considered to unnecessarily divert the gist of the present disclosure, such explanation has been omitted but would be understood by those skilled in the art. The accompanying drawings are used to help easily understand the technical idea of the present disclosure and it should be understood that the idea of the present disclosure is not limited by the accompanying drawings. The idea of the present disclosure should be construed to extend to any alterations, equivalents and substitutes besides the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be connected with the another element or intervening elements may also be present. In contrast, when an element is referred to as being "directly connected with" another element, there are no intervening elements present.

A singular representation may include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps may likewise be utilized.

Display devices presented herein may be implemented using a variety of different types of terminals. Examples of such devices include cellular phones, smart phones, user equipment, laptop computers, digital broadcast terminals, personal digital assistants (PDAs), portable multimedia players (PMPs), navigators, portable computers (PCs), slate PCs, tablet PCs, ultra books, wearable devices (for example, smart watches, smart glasses, head mounted displays (HMDs), and the like.

By way of non-limiting example only, further description will be made with reference to particular types of mobile terminals. However, such teachings apply equally to other types of terminals, such as those types noted above. In addition, these teachings may also be applied to stationary terminals such as digital TV, desktop computers, and the like. Hereinafter, for convenience of description, the mobile terminal will be described as one example of the flexible display device.

Figure 1:
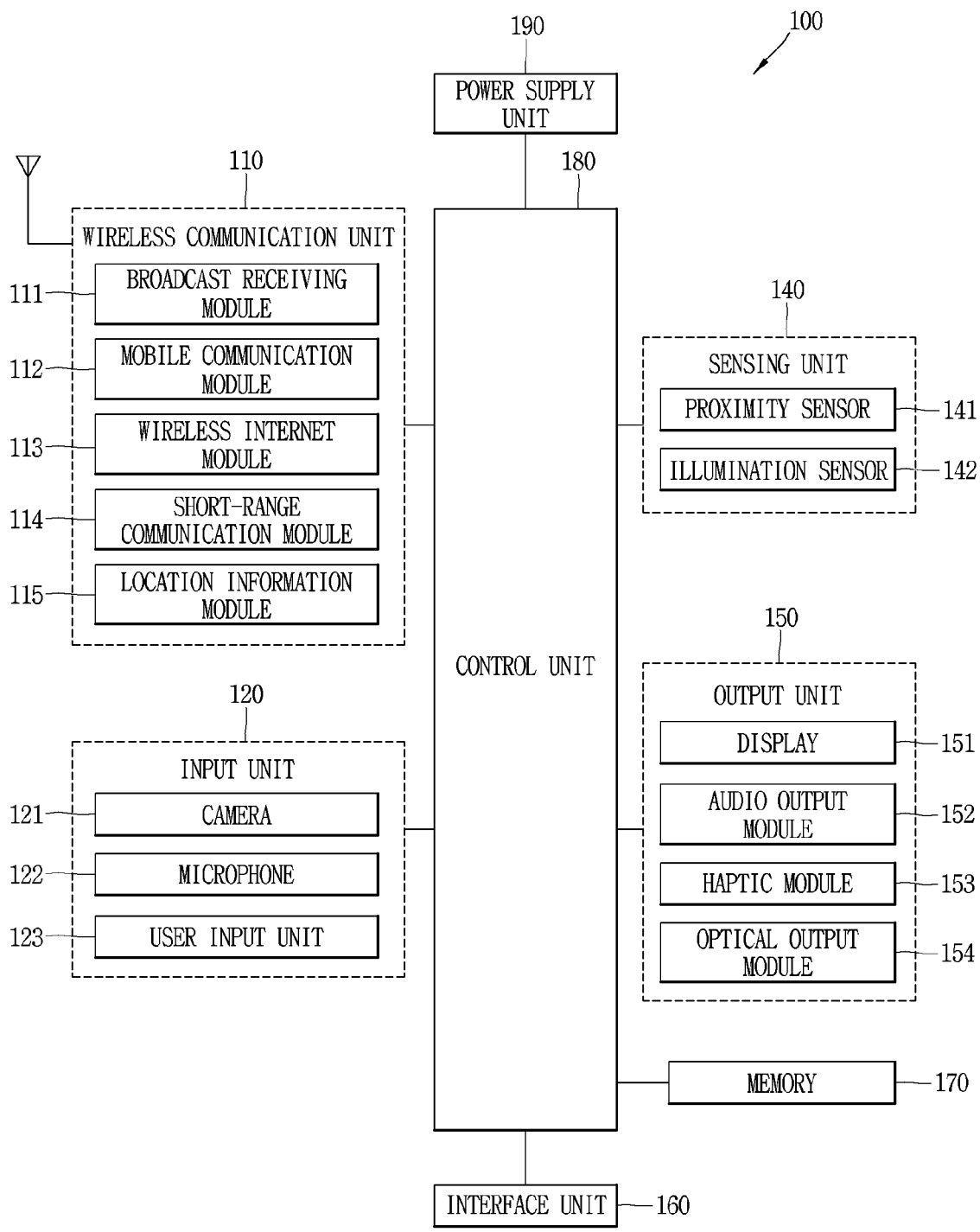
FIG. 1 is a block diagram of a mobile terminal in accordance with the present disclosure.

FIG. 1 is a block diagram of a mobile terminal in accordance with the present disclosure.

The mobile terminal 100 may be shown having components such as a wireless communication unit 110, an input unit 120, a sensing unit 140, an output unit 150, an interface unit 160, a memory 170, a controller 180, and a power supply unit 190. It is understood that implementing all of the illustrated components is not a requirement. Greater or fewer components may alternatively be implemented.

In more detail, the wireless communication unit 110 may typically include one or more modules which permit communications such as wireless communications between the mobile terminal 100 and a wireless communication system, communications between the mobile terminal 100 and another mobile terminal, or communications between the mobile terminal 100 and an external server. Further, the wireless communication unit 110 may typically include one or more modules which connect the mobile terminal 100 to one or more networks.

The wireless communication unit 110 may include one or more of a broadcast receiver 111, a mobile communication module 112, a wireless Internet module 113, a short-range communication module 114, and a location information module 115.

First, regarding the wireless communication unit 110, the broadcast receiver 111 is configured to receive a broadcast signal and/or broadcast associated information from an external broadcast managing server via a broadcast channel. The broadcast channel may include a satellite channel, a terrestrial channel, or both. In some embodiments, two or more broadcast receivers may be utilized to facilitate simultaneous reception of two or more broadcast channels, or to support switching among broadcast channels.

The broadcast management server may be a server that generates and transmits a broadcast signal and/or broadcast associated information or a server that receives a previously generated broadcast signal and/or broadcast associated information and transmits the same to a terminal. The broadcast signal may include a TV broadcast signal, a radio broadcast signal, a data broadcast signal, and the like. Also, the broadcast signal may further include a broadcast signal in a form that a TV or radio broadcast signal is combined with a data broadcast signal.

The broadcast signal may be encrypted by at least one of technical standards (or broadcasting methods, e.g., ISO, IEC, DVB, ATSC, etc.) for transmitting and receiving a digital broadcast signal. The broadcast receiving module 111 may receive the digital broadcast signal using a method suitable for a technical standard selected from those technical standards.

Examples of the broadcast associated information may include information associated with a broadcast channel, a broadcast program, a broadcast service provider, and the like. The broadcast associated information may be provided via a mobile communication network. In this case, the broadcast associated information may be received by the mobile communication module 112.

The broadcast associated information may be implemented in various formats. For instance, broadcast associated information may include Electronic Program Guide (EPG) of Digital Multimedia Broadcasting (DMB), Electronic Service Guide (ESG) of Digital Video Broadcast-Handheld (DVB-H), and the like. The broadcast signal and/or the broadcast related information received through the broadcast receiving module 111 may be stored in the memory 160.

The mobile communication module 112 can transmit and/or receive wireless signals to and from one or more network entities. Typical examples of a network entity include a base station, an external mobile terminal, a server, and the like. Such network entities form part of a mobile communication network, which is constructed according to technical standards or communication methods for mobile communications (for example, Global System for Mobile Communication (GSM), Code Division Multi Access (CDMA), CDMA2000 (Code Division Multi Access 2000), EV-DO (Enhanced Voice-Data Optimized or Enhanced Voice-Data Only), Wideband CDMA (WCDMA), High Speed Downlink Packet access (HSDPA), HSUPA (High Speed Uplink Packet Access), Long Term Evolution (LTE), LTE-A (Long Term Evolution-Advanced), and the like).

The wireless signal may include various types of data depending on a voice call signal, a video call signal, or a text/multimedia message transmission/reception.

The wireless Internet module 113 refers to a module for wireless Internet access. This module may be internally or externally coupled to the mobile terminal 100. The wireless Internet module 113 may transmit and/or receive wireless signals via communication networks according to wireless Internet technologies.

Examples of such wireless Internet access include Wireless LAN (WLAN), Wireless Fidelity (Wi-Fi), Wi-Fi Direct, Digital Living Network Alliance (DLNA), Wireless Broadband (WiBro), Worldwide Interoperability for Microwave Access (WiMAX), High Speed Downlink Packet Access (HSDPA), High Speed Uplink Packet Access (HSUPA), Long Term Evolution (LTE), LTE-advanced (LTE-A) and the like. The wireless Internet module 113 may transmit/receive data according to one or more of such wireless Internet technologies, and other Internet technologies as well.

When the wireless Internet access is implemented according to, for example, WiBro, HSDPA, HSUPA, GSM, CDMA, WCDMA, LTE, LTE-A and the like, as part of a mobile communication network, the wireless Internet module 113 performs such wireless Internet access. As such, the Internet module 113 may cooperate with, or function as, the mobile communication module 112.

The short-range communication module 114 is configured to facilitate short-range communications. Suitable technologies for implementing such short-range communications include BLUETOOTH™, Radio Frequency IDentification (RFID), Infrared Data Association (IrDA), Ultra-WideBand (UWB), ZigBee, Near Field Communication (NFC), Wireless-Fidelity (Wi-Fi), Wi-Fi Direct, Wireless USB (Wireless Universal Serial Bus), and the like. The short-range communication module 114 in general supports wireless communications between the mobile terminal 100 and a wireless communication system, communications between the mobile terminal 100 and another mobile terminal 100, or communications between the mobile terminal and a network where another mobile terminal 100 (or an external server) is located, via wireless area networks. One example of the wireless area networks is a wireless personal area network.

Here, another mobile terminal (which may be configured similarly to mobile terminal 100) may be a wearable device, for example, a smart watch, a smart glass or a head mounted display (HMD), which is able to exchange data with the mobile terminal 100 (or otherwise cooperate with the mobile terminal 100). The short-range communication module 114 may sense or recognize the wearable device, and permit communication between the wearable device and the mobile terminal 100. In addition, when the sensed wearable device is a device which is authenticated to communicate with the mobile terminal 100, the controller 180, for example, may cause transmission of at least part of data processed in the mobile terminal 100 to the wearable device via the short-range communication module 114. Hence, a user of the wearable device may use the data processed in the mobile terminal 100 on the wearable device. For example, when a call is received in the mobile terminal 100, the user may answer the call using the wearable device. Also, when a message is received in the mobile terminal 100, the user can check the received message using the wearable device.

The location information module 115 is generally configured to detect, calculate, derive or otherwise identify a position (or current position) of the mobile terminal. As an example, the location information module 115 includes a Global Position System (GPS) module, a Wi-Fi module, or both. For example, when the mobile terminal uses a GPS module, a position of the mobile terminal may be acquired using a signal sent from a GPS satellite. As another example, when the mobile terminal uses the Wi-Fi module, a position of the mobile terminal can be acquired based on information related to a wireless access point (AP) which transmits or receives a wireless signal to or from the Wi-Fi module. If desired, the location information module 115 may alternatively or additionally function with any of the other modules of the wireless communication unit 110 to obtain data related to the position of the mobile terminal. The location information module 115 is a module used for acquiring the position (or the current position) and may not be limited to a module for directly calculating or acquiring the position of the mobile terminal.

The input unit 120 may include a camera 121 or an image input unit for obtaining images or video, a microphone 122, which is one type of audio input device for inputting an audio signal, and a user input unit 123 (for example, a touch key, a mechanical key, and the like) for allowing a user to input information. Data (for example, audio, video, image, and the like) may be obtained by the input unit 120 and may be analyzed and processed according to user commands.

Such cameras 121 may process image frames of still pictures or video obtained by image sensors in a video or image capture mode. The processed image frames can be displayed on the display 151 or stored in memory 170. Meanwhile, the cameras 121 may be arranged in a matrix configuration to permit a plurality of images having various angles or focal points to be input to the mobile terminal 100. Also, the cameras 121 may be located in a stereoscopic arrangement to acquire left and right images for implementing a stereoscopic image.

The microphone 122 processes an external audio signal into electric audio (sound) data. The processed audio data can be processed in various manners according to a function executed in the mobile terminal 100. The microphone 122 may include assorted noise removing algorithms to remove unwanted noise generated in the course of receiving the external audio signal.

The user input unit 123 is a component that receives an input of information from a user. Such user input may enable the controller 180 to control operation of the mobile terminal 100 in correspondence with the received information. The user input unit 123 may include one or more of a mechanical input element (for example, a mechanical key, a button located on a front and/or rear surface or a side surface of the mobile terminal 100, a dome switch, a jog wheel, a jog switch, and the like), or a touch-sensitive input element, among others. As one example, the touch-sensitive input element may be a virtual key, a soft key or a visual key, which is displayed on a touch screen through software processing, or a touch key which is located on the mobile terminal at a location that is other than the touch screen. On the other hand, the virtual key or the visual key may be displayed on the touch screen in various shapes, for example, graphic, text, icon, video, or a combination thereof.

The sensing unit 140 is generally configured to sense one or more of internal information of the mobile terminal, surrounding environment information of the mobile terminal, user information, or the like, and generate a corresponding sensing signal. The controller 180 generally cooperates with the sending unit 140 to control operations of the mobile terminal 100 or execute data processing, a function or an operation associated with an application program installed in the mobile terminal based on the sensing signal. The sensing unit 140 may be implemented using any of a variety of sensors, some of which will now be described in more detail.

For example, the sensing unit 140 may include at least one of a proximity sensor 141, an illumination sensor 142, a touch sensor, an acceleration sensor, a magnetic sensor, a G-sensor, a gyroscope sensor, a motion sensor, a red, green, and blue (RGB) sensor, an infrared (IR) sensor, a finger scan sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like). The mobile terminal disclosed herein may be configured to utilize information obtained from two or more sensors of the sensing unit 140, and combinations thereof.

The proximity sensor 141 refers to a sensor to sense presence or absence of an object approaching a surface, or an object existing near a surface, by using an electromagnetic field, infrared light, or the like without a mechanical contact. The proximity sensor 141 may be arranged at an inner area of the mobile terminal covered by the touch screen, or near the touch screen.

The proximity sensor 141, for example, may include any of a transmissive type photoelectric sensor, a direct reflective type photoelectric sensor, a mirror reflective type photoelectric sensor, a high-frequency oscillation proximity sensor, a capacitance type proximity sensor, a magnetic type proximity sensor, an infrared rays proximity sensor, and the like. When the touch screen is implemented as a capacitance type, the proximity sensor 141 may sense proximity of a pointer relative to the touch screen by changes of an electromagnetic field, which is responsive to an approach of an object with conductivity. In this case, the touch screen (touch sensor) may also be categorized as a proximity sensor.

The term "proximity touch" will often be referred to herein to denote the scenario in which a pointer is positioned to be proximate to the touch screen without contacting the touch screen. The term "contact touch" will often be referred to herein to denote the scenario in which a pointer makes physical contact with the touch screen. For the position corresponding to the proximity touch of the pointer relative to the touch screen, such position will correspond to a position where the pointer is perpendicular to the touch screen. The proximity sensor 141 may sense proximity touch, and proximity touch patterns (for example, distance, direction, speed, time, position, moving status, and the like). In general, controller 180 processes data corresponding to proximity touches and proximity touch patterns sensed by the proximity sensor 141, and cause output of visual information on the touch screen. In addition, the controller 180 can control the mobile terminal 100 to execute different operations or process different data (or information) according to whether a touch with respect to a point on the touch screen is either a proximity touch or a contact touch.

The touch sensor senses a touch (or a touch input) applied to the touch screen using at least one of a variety of touch methods. Examples of such touch methods include a resistive type, a capacitive type, an infrared type, an ultrasonic type, and a magnetic field type, among others.

As one example, the touch sensor may be configured to convert changes of pressure applied to a specific part of the display 151, or convert capacitance occurring at a specific part of the display 151, into electric input signals. The touch sensor may also be configured to sense not only a touched position and a touched area, but also touch pressure and/or touch capacitance. A touch object is generally used to apply a touch input to the touch sensor. Examples of typical touch objects include a finger, a touch pen, a stylus pen, a pointer, or the like.

When a touch input is sensed by a touch sensor, a signal(s) corresponding to the touch input is transmitted to a touch controller. The touch controller may process the received signals, and then transmit corresponding data to the controller 180. Accordingly, the controller 180 may sense which area of the flexible display 151 has been touched. Here, the touch controller may be a component separate from the controller 180, the controller 180, and combinations thereof.

Meanwhile, the controller 180 may execute the same or different controls according to a type of touch object that touches the touch screen or a touch key provided in addition to the touch screen. Whether to execute the same or different control according to the object which provides a touch input may be decided based on a current operating state of the mobile terminal 100 or a currently executed application program, for example.

In addition, the controller 180 may be a processor that drives various applications executed in the flexible display device. For example, various applications including a camera application executed in the flexible display device may be driven.

The touch sensor and the proximity sensor may be implemented individually, or in combination, to sense various types of touches. Such touches include a short (or tap) touch, a long touch, a multi-touch, a drag touch, a flick touch, a pinch-in touch, a pinch-out touch, a swipe touch, a hovering touch, and the like.

If desired, an ultrasonic sensor may be implemented to recognize location information relating to a touch object using ultrasonic waves. The controller 180, for example, may calculate a position of a wave generation source based on information sensed by an illumination sensor and a plurality of ultrasonic sensors. Since light is much faster than ultrasonic waves, the time for which the light reaches the optical sensor is much shorter than the time for which the ultrasonic wave reaches the ultrasonic sensor. The position of the wave generation source may be calculated using this fact. For instance, the position of the wave generation source may be calculated using the time difference from the time that the ultrasonic wave reaches the sensor based on the light as a reference signal.

The camera 121, which has been depicted as a component of the input unit 120, includes at least one a camera sensor (CCD, CMOS etc.), a photo sensor (or image sensors), and a laser sensor.

Implementing the camera 121 with a laser sensor may allow detection of a touch of a physical object with respect to a 3D stereoscopic image. The photo sensor may be laminated on, or overlapped with, the display device. The photo sensor may be configured to scan movement of the physical object in proximity to the touch screen. In more detail, the photo sensor may include photo diodes and transistors (TRs) at rows and columns to scan content received at the photo sensor using an electrical signal which changes according to the quantity of applied light. Namely, the photo sensor may calculate the coordinates of the physical object according to variation of light to thus obtain location information of the physical object.

The flexible display 151 is generally configured to output information processed in the mobile terminal 100. For example, the flexible display 151 may display execution screen information of an application program executing at the mobile terminal 100 or user interface (UI) and graphic user interface (GUI) information in response to the execution screen information.

Also, the flexible display 151 may be implemented as a stereoscopic display for displaying stereoscopic images.

A typical stereoscopic display may employ a stereoscopic display scheme such as a stereoscopic scheme (a glass scheme), an auto-stereoscopic scheme (glassless scheme), a protrusion scheme (holographic scheme), or the like.

The output unit 150 may typically be configured to output various types of information, such as audio, video, tactile output, and the like. The output unit 150 may include at least one of the flexible display 151, an audio output module 152, a haptic module 153, and an optical output module 154. The flexible display 151 may have an inter-layered structure or an integrated structure with a touch sensor in order to implement a touch screen. The touch screen may function as the user input unit 123 which provides an input interface between the mobile terminal 100 and the user and simultaneously provide an output interface between the mobile terminal 100 and a user.

The audio output module 152 may receive audio data from the wireless communication unit 110 or output audio data stored in the memory 170 during modes such as a signal reception mode, a call mode, a record mode, a voice recognition mode, a broadcast reception mode, and the like. The audio output module 152 can provide audible output related to a particular function (e.g., a call signal reception sound, a message reception sound, etc.) performed by the mobile terminal 100. The audio output module 152 may also be implemented as a receiver, a speaker, a buzzer, or the like.

A haptic module 153 can be configured to generate various tactile effects that a user feels, perceives, or otherwise experiences. A typical example of a tactile effect generated by the haptic module 153 is vibration. The strength, pattern and the like of the vibration generated by the haptic module 153 can be controlled by user selection or setting by the controller. For example, the haptic module 153 may output different vibrations in a combining manner or a sequential manner.

Besides vibration, the haptic module 153 can generate various other tactile effects, including an effect by stimulation such as a pin arrangement vertically moving to contact skin, a spray force or suction force of air through a jet orifice or a suction opening, a touch to the skin, a contact of an electrode, electrostatic force, an effect by reproducing the sense of cold and warmth using an element that can absorb or generate heat, and the like.

The haptic module 153 can also be implemented to allow the user to feel a tactile effect through a muscle sensation such as the user's fingers or arm, as well as transferring the tactile effect through direct contact. Two or more haptic modules 153 may be provided according to the particular configuration of the mobile terminal 100.

An optical output module 154 can output a signal for indicating an event generation using light of a light source. Examples of events generated in the mobile terminal 100 may include message reception, call signal reception, a missed call, an alarm, a schedule notice, an email reception, information reception through an application, and the like.

A signal output by the optical output module 154 may be implemented such that the mobile terminal emits monochromatic light or light with a plurality of colors. The signal output may be terminated as the mobile terminal senses that a user has checked the generated event, for example.

The interface unit 160 serves as an interface with various types of external devices that are coupled to the mobile terminal 100. The interface unit 160, for example, may include any of wired or wireless headset ports, external power supply ports, wired or wireless data ports, memory card ports, ports for connecting a device having an identification module, audio input/output (I/O) ports, video I/O ports, earphone ports, and the like. In some cases, the mobile terminal 100 may perform assorted control functions associated with a connected external device, in response to the external device being connected to the interface unit 160.

The identification module may be a chip that stores various information for authenticating authority of using the mobile terminal 100 and may include a user identity module (UIM), a subscriber identity module (SIM), a universal subscriber identity module (USIM), and the like. In addition, the device having the identification module (also referred to herein as an "identifying device") may take the form of a smart card. Accordingly, the identifying device can be connected with the terminal 100 via the interface unit 160.

When the mobile terminal 100 is connected with an external cradle, the interface unit 160 can serve as a passage to allow power from the cradle to be supplied to the mobile terminal 100 or may serve as a passage to allow various command signals input by the user from the cradle to be transferred to the mobile terminal therethrough. Various command signals or power input from the cradle may operate as signals for recognizing that the mobile terminal is properly mounted on the cradle.

The memory 170 can store programs to support operations of the controller 180 and store input/output data (for example, phonebook, messages, still images, videos, etc.). The memory 170 may store data related to various patterns of vibrations and audio which are output in response to touch inputs on the touch screen.

The memory 170 may include one or more types of storage mediums including a flash memory type, a hard disk type, a solid state disk (SSD) type, a silicon disk drive (SDD) type, a multimedia card micro type, a card-type memory (e.g., SD or DX memory, etc.), a Random Access Memory (RAM), a Static Random Access Memory (SRAM), a Read-Only Memory (ROM), an Electrically Erasable Programmable Read-Only Memory (EEPROM), a Programmable Read-Only memory (PROM), a magnetic memory, a magnetic disk, an optical disk, and the like. The mobile terminal 100 may also be operated in relation to a network storage device that performs the storage function of the memory 170 over a network, such as the Internet.

The controller 180 functions to control an overall operation of the mobile terminal 100, in addition to the operations associated with the application programs. The controller 180 may provide or process information or functions appropriate for a user by processing signals, data, information and the like, which are input or output by the aforementioned various components, or activating application programs stored in the memory 170.

Also, the controller 180 may control at least some of the components illustrated in FIG. 1A to execute an application program that have been stored in the memory 170. In addition, the controller 180 may control at least two of those components included in the mobile terminal 100 to activate the application program.

The power supply unit 190 may be configured to receive external power or provide internal power in order to supply appropriate power required for operating elements and components included in the mobile terminal 100. The power supply unit 190 may include a battery 191, and the battery may be configured to be embedded in the terminal body, or configured to be detachable from the terminal body.

The power supply unit 190 may include a connection port. The connection port may be configured as one example of the interface unit 160 to which an external charger for supplying power to recharge the battery is electrically connected.

As another example, the power supply unit 190 may be configured to recharge the battery in a wireless manner without use of the connection port. In this example, the power supply unit 190 can receive power, transferred from an external wireless power transmitter, using at least one of an inductive coupling method which is based on magnetic induction or a magnetic resonance coupling method which is based on electromagnetic resonance.

At least part of the components may cooperatively operate to implement an operation, a control or a control method of a mobile terminal according to various embodiments disclosed herein. Also, the operation, the control or the control method of the mobile terminal may be implemented on the mobile terminal by an activation of at least one application program stored in the memory 170.

(a) and (b) of FIG. 2 are perspective views illustrating an exterior appearance of a front surface of the flexible display device in a first state and in a second state, respectively. (a) and (b) of FIG. 3 are perspective views illustrating an exterior appearance of a rear surface of the flexible display device in the first state and in the second state, respectively.

The flexible display device is a device capable of varying in size of a screen due to a deformation of the flexible display, which may be understood as one of the above-described mobile terminals. In the present disclosure, the device will be referred to as a flexible display device 100.

The flexible display device 100 according to the present disclosure may include a first body 101, a second body 102, the flexible display 151, and a rear cover glass 200.

The first body 101 and the second body 102 may define an exterior appearance of the flexible display device 100. The first body 101 and the second body 102 are configured to be movable relative to each other. The first body 101 and the second body 102 may achieve the first state, the second state, and a stroke state.

Specifically, the first state is an arrangement state in which the first body 101 and the second body 102 are located adjacent to each other and have a largest area of the flexible display 151 exposed to the rear surface of the second body 102. The second state is an arrangement state in which the first body 101 and the second body 102 move away from each other and have a largest area of the flexible display 151 exposed to a front surface of the first body 101. The stroke state is a state in which the first body 101 and the second body 102 are interchanged between the first state and the second state.

The flexible display device 100 in the first state has a shorter length in a first direction than in the second state. Since the flexible display device 100 in the second state is extended in the first direction, a size of the flexible display 151 disposed on the front surface of the flexible display device 100 become larger than in the first state. A direction in which the flexible display device 100 is extended is referred to as a first direction, and a direction in which the flexible display device 100 is contracted so as to be changed from the second state to the first state is referred to as a second direction. And a direction perpendicular to the first direction and the second direction is referred to as a third direction.

The flexible display device 100 of the present disclosure may be changed from the first state in which a display is disposed on a front surface such as a bar-like mobile terminal to the second state by extending the screen as illustrated in (b) of FIG. 2. In the second state, the area of the flexible display 151 located at the front surface increases, and the area of the display located at the rear surface decreases as illustrated in (b) of FIG. 3. That is, the display, which was positioned on the rear surface in the first state, is moved to the front surface in the second state.

As such, the display may use the flexible display 151 that is bendable so as for the location of the display can be changed. The flexible display 151 refers to a durable display that is lightweight and does not break easily by being fabricated on a thin, flexible substrate, such as paper, which is bent, curved, folded, twisted or rolled while maintaining characteristics of an existing flat panel display.

In addition, an electronic paper is a display to which general ink characteristics are applied, and is different from the existing flat panel display in view of using reflected light. The electronic paper may change information by using a twist ball or electrophoresis using a capsule.

In a state where the flexible display 151 is not deformed (e.g., a state having an infinite radius of curvature, hereinafter, referred to as a default state), a display area of the flexible display 151 is flat. When the default state is switched to a state where the flexible display is deformed by an external force (e.g., a state having a finite radius of curvature, hereinafter, referred to as a deformed state), the display area may be curved. As illustrated in the drawing, information displayed in the deformed state may be visual information output on a curved surface. Such visual information is realized by independently controlling an emission of unit pixels (sub-pixels) arranged in a matrix form. The unit pixel denotes an elementary unit for representing one color.

The flexible display 151 may be deformed to a curved state (e.g., curved up or down, or left or right), other than a flat state, in the default state. When an external force is applied to the curved flexible display 151, the flexible display 151 may be deformed into the flat state (or less curved state) or a more curved state.

Meanwhile, the flexible display 151 may be combined with a touch sensor to implement a flexible touch screen. When a touch is applied to the flexible touch screen, the controller 180 (see FIG. 1) may perform a control corresponding to the touch input. The flexible touch screen may be configured to sense a touch input in the deformed state as well as in the default state.

The touch sensor senses a touch (or a touch input) applied to the touch screen using at least one of a variety of touch methods. Examples of such touch methods include a resistive type, a capacitive type, an infrared type, an ultrasonic type, and a magnetic field type, among others.

As one example, the touch sensor may be configured to convert changes of pressure applied to a specific part of the display 151, or convert capacitance occurring at a specific part of the display 151, into electric input signals. The touch sensor may also be configured to sense not only a touched position and a touched area, but also touch pressure and/or touch capacitance. A touch object is generally used to apply a touch input to the touch sensor. Examples of typical touch objects include a finger, a touch pen, a stylus pen, a pointer, or the like.

Meanwhile, the flexible display device 100 according to this varied example may be provided with a deformation detecting unit to detect a deformation of the flexible display 151. The deformation detecting unit may be included in the sensing unit 140 (see FIG. 1).

The deformation detecting unit may be provided on the flexible display 151 or on a case 105 to detect information related to the deformation of the flexible display 151. Here, the information related to the deformation may be a direction in which the flexible display 151 is deformed, a deformed degree, a deformed position, a deformed time, and an acceleration at which the deformed flexible display 151 is restored. In addition, the information may be various which is detectable as the flexible display 151 is curved.

Also, the controller 180 may change information displayed on the flexible display 151 or generate a control signal to control functions of the flexible display device 100 based on the information related to the deformation of the flexible display 151 detected by the deformation detecting unit.

A state of the flexible display 151 is not always be changed by an external force. For example, when the flexible display 151 is in the first state, the flexible display 151 may be deformed to the second state by a command of an application or a user. As such, a driving unit may be further provided to deform the flexible display without an external force.

The flexible display 151 of the present disclosure may be bent 180 degrees, so as a part of which to be located at the front surface of the flexible display device 100, and a part of which to be located in the rear surface of the flexible display device 100. Since a size of an entire area of the flexible display 151 is fixed, when the area of the flexible display 151 located on the front surface of the flexible display device 100 increases, the area of the flexible display 151 located on the rear surface of the flexible display device 100 relatively decreases.

As the flexible display 151 is disposed up to the rear surface of the flexible display device 100, in addition to the front surface of the flexible display device 100, a space where an antenna implemented in a rear case in the related art to be mounted is limited. Accordingly, the antenna may be implemented on the flexible display 151 instead of mounting the antenna in the rear case.

A display built-in antenna (AOD, Antenna on Display) is an antenna in which patterned electrode layers and dielectric layers form a transparent film. The display built-in antenna can be implemented thinner than the related art antenna implemented by copper-nickel plating laser direct structuring (LDS) technology, which has an advantage of not appearing outside and barely affecting the thickness. In addition, the display built-in antenna is able to transmit and receive a signal in a direction in which the display is located. Such display built-in antenna may be used in a terminal having a display on both sides as in the present disclosure.

Referring to FIG. 3, the rear cover glass 200 may be coupled to the second body 102. When the second body 102 is moved relative to the first body 101 so as for the first body 101 and the second body 102 to achieve the second state, the rear cover glass 200 is moved together with the second body 102.

Accordingly, the rear cover glass 200 is configured to cover the flexible display 151 disposed on the rear surface of the second body 102 in the first state, and to cover an inner portion of the second body 102 disposed on an inner surface of the second body 102 in the second state.

The rear cover glass 200 may be mounted on the second body 102 to protect the flexible display 151 disposed on the rear surface from outside. In addition, the rear cover glass 200 may be detached from the second body 102 to expose the flexible display 151. In this manner, a user may remove dust or the like introduced between the rear cover glass 200 and the flexible display 151.

(a) of FIG. 4 is a cross-sectional view taken along a line A-A in (a) of FIG. 2, and (b) of FIG. 4 is a cross-sectional view taken along a line B-B in (b) of FIG. 2. FIG. 5 is a partial cross-sectional view illustrating (b) of FIG. 4 enlarged.

FIG. 4 is a cross-sectional view of the A-A and B-B of FIG. 2, wherein the flexible display device 100 according to the present disclosure includes the first body 101, the second body 102 that slides in the first direction with respect to the first body 101, and a supporting plate 103 that slides in the first direction with respect to the second body 102. Hereinafter, a description will be given with reference to FIGS. 2 and 3.

The first body 101 and the second body 102 may include the front surface, the rear surface, and the side surface, and may define an exterior appearance of the flexible display device 100 in a hexahedral shape.

A first region 1511 disposed at one side of the flexible display 151 is fixed to the front surface of the first body 101. A third region 1513 neighboring the first region 1511 in the first direction may partially cover the front surface of the second body 102 and partially cover the rear surface of the second body 102.

A second region 1512 disposed at another side of the flexible display 151 is disposed at a rear surface of the mobile terminal. The second region 1512 is coupled to the supporting plate 103 rather than directly coupled to the second body 102. The supporting plate 103 is a plate-like member slidably coupled to the rear surface of the second body 102 in the first direction.

As illustrated in (b) of FIG. 3, a slide slot 1025 extending in the first direction is formed at the second body 102. The supporting plate 103 may move along the slide slot 1025. However, although the slide slot 1025 is illustrated as being formed at the rear surface of the second body 102 in the drawing, the slide slot 1025 may alternatively be formed at the side surface of the second body 102.

To sum up, the flexible display 151 may include the first region 1511 fixed to the first body 101, the second region 1512 fixed to the supporting plate 103, and the third region 1513 located between the first region 1511 and the second region 1512 and disposed on the front surface or the rear surface according to a state of the flexible display device 100.

The first region 1511 and the second region 1512 of the flexible display 151 maintain a default state which is flat and the curvature does not change in a process of changing between the first state and the second state of the flexible display device 100. Meanwhile, the third region 1513 is bent at another side of the second body 102 and curved to the rear surface.

When changing from the first state to the second state, an area of the third region 1513 located in the first direction of the first region 1511 is widened. A position being bent on the third region 1513 is correspondingly changed according to a sliding position of the second body 102.

Since a foldable mobile terminal or a flexible display device that unfolds like a book repeatedly bends only a specific position, a force is repeatedly applied to only one spot, causing a high risk of damage. On the other hand, the flexible display device 100 of the present disclosure can reduce a fatigue caused by a deformation that is intensively applied only to a specific spot of the flexible display 151 in the process of changing between the first state and the second state. Accordingly, the flexible display device 100 of the present disclosure can prevent damage caused by fatigue accumulation of the flexible display 151.

The first body 101 may include a first front surface 1011, a first rear surface 1012, and a second rear surface 1013. The first front surface 1011 is coupled to the first region 1511 of the flexible display 151. The first rear surface 1012 is exposed from the rear surface of the first body 101 to an outer side in the first state as illustrated in (a) of FIG. 3. As illustrated in (b) of FIG. 3, the second rear surface 1013 is covered by the second and third regions of the flexible display in the first state, and is exposed to the outside in the second state.

Since the first rear surface 1012 is always exposed to the outside, the camera 121, a flash, the proximity sensor 141, and the like may be disposed on the first rear surface 1012.

Since a typical bar-like terminal has a display on only one side thereof, cameras are required on both a rear surface and a front surface of the terminal to capture an image of an object located at an opposite side of a user or an image of the user him/herself. However, since the flexible display 151 is also located on the rear surface of the flexible display device 100 of the present disclosure, capturing an image of an object located at an opposite side of a user or an image of the user him/herself is possible by using one camera.

In detail, since the display is visually disposed on both the front surface and the rear surface of the flexible display device 100, a user can take a picture while viewing the front surface of the flexible display device 100. In addition, the user may take a picture with the camera facing the user while viewing the rear surface of the flexible display device 100.

The camera 121 may include a plurality of cameras having different angles of view, such as wide angle, ultra-wide angle, and telephoto. In addition to the camera 121, the proximity sensor 141, an audio output module, and the like may be provided. An antenna 116 may be implemented on the first rear surface 1012.

The first body 101 may include a side surface 1014 surrounding a circumference of the flexible display device 100. The first body 101 covers side surfaces of both sides of the third direction and a side surface of one side of the first direction except for an end portion of the first direction where the second body 102 is inserted into and drawn out. An interface unit to connect a power port or an ear jack or a user input unit such as a volume button may be disposed on the side surface 1014. In a case of including a metal material, the side surface may serve as an antenna.

The second body 102 may include a second front surface 1021, a third rear surface 1022, and a side frame 1024.

The second front surface 1021 is disposed on a rear surface of a first front surface 1011 of the first body 101. When the flexible display device 100 changes from the first state to the second state, the second front surface 1021 supports a rear surface of the flexible display 151, here, a front surface of the flexible display 151 is extended. That is, the second front surface 1021 supports the third region 1513 disposed on the front surface of the flexible display 151 in the second state.

The third rear surface 1022 covers a rear surface of the second rear surface 1013 of the first body 101. The above-described slide slot 1025 may be formed on the third rear surface 1022. The third rear surface 1022 is not exposed to the outside in the first state of the flexible display device 100, but may be exposed to the outside when the flexible display device 100 is changed to the second state.

Meanwhile, (a) of FIG. 4 illustrates a cross section in the first state, and (b) of FIG. 4 illustrates a cross section in the second state.

Here, when changing from the first state to the second state, a distance in which a support plate 103 is moved and a distance in which the second body 102 is moved are different. Specifically, when changing from the first state to the second state, a distance 2d in which the support plate 103 is moved is twice a distance d in which an end portion of the second body 102 is moved.

Specifically, since the flexible display 151 connected to the support plate 103 moves to the front surface, it has a same effect as moving the rear surface of the second body 102 and the front surface of the second body 102 simultaneously. Therefore, when changing from the first state to the second state, the distance 2d in which the support plate 103 is moved is twice the distance d in which the end portion of the second body 102 is moved.

Accordingly, there may be a portion on which the flexible display 151 is not disposed on the rear surface of the second body 102 in the second state. Since the portion does not have flexible display 151, there is no device capable of reflecting light. Therefore, when light is transmitted through the rear cover glass 200 from outside, components in the second body 102 may be showing.

That is, as the external light is transmitted in the second state, an area 102b showing internal components of the second body 102 may be generated. Accordingly, the rear cover glass 200 described above may be provided to reduce showing of the inner portion through the rear surface of the second body 102.

A user input may be performed on a side surface of the flexible display device 100 by using a touch sensor of the flexible display 151. The side frame 1024 may partially include a conductive material for touch input. A protrusion may be provided on a portion including the conductive material so that a user may touch the protrusion to input a user command.

A cylindrical roller 1028 may be provided at an end portion of the second body 102 in the first direction so that the third region 1513 of the flexible display 151 is wound around the roller 1028 and the wound part may be gently curved with a predetermined curvature.

The roller 1028 is positioned at the end portion of the second body 102 in the first direction, brought into contact with an inner surface of the flexible display 151, and rotated when the flexible display 151 moves so that the flexible display 151 slides smoothly from the rear surface to the front surface or vice versa when the second body 102 slides.

Since the flexible display 151 wound on the roller 1028 is located at an end portion of the flexible display device 100 in the first direction, the flexible display device 100 may be broken when an impact such as dropping the flexible display device 100 is applied thereto. To prevent a breakage, the second body 102 may further include the side frame 1024 to protect the flexible display 151 wound on the roller 1028 as illustrated in FIG. 2.

The side frame 1024 may prevent a breakage problem that occurs when a bent surface of the flexible display 151 in an out-folding manner is exposed to the outside, thereby improving durability of the flexible display device 100.

The side frame 1024 surrounds a bent end portion of the flexible display 151 at another side of the flexible display device 100 to protect the flexible display 151 wound on the roller 1028. The side frame 1024 may include an opaque material or a transparent material, or may be configured by mixing an opaque material and a transparent material. A user may view an image or a text output from the flexible display 151 through a transparent portion.

Meanwhile, the end portion of the second body 102 may be formed to be bent. Referring to FIG. 5, the end portion of the second body 102 close to the side frame 1024 may be bent corresponding to an outer circumferential surface of the side frame 1024.

Accordingly, one end of the rear cover glass 200 mounted on the second body 102 may be bent along the bent end portion of the second body 102. Referring to FIG. 5, the rear cover glass 200 may be bent corresponding to the outer circumferential surface of the side frame 1024 of the second body 102. As the rear cover glass 200 is formed to be bent as such, the rear cover glass 200 can be mounted to the second body 102 while forming an even surface.

FIG. 6 is a view illustrating the rear cover glass according to an embodiment of the present disclosure.

The rear cover glass 200 according to an embodiment of the present disclosure may include a cover glass 210, a high-reflective layer 240, and a low-reflective layer 260. In addition, the rear cover glass 200 may further include adhesive layers 220 and 250 and a PET film 230.

The cover glass 210 is disposed on an outermost portion of the rear cover glass 200. The cover glass 210 may protect the flexible display 151 from foreign substances such as dust introduced from outside.

The high-reflective layer 240 is disposed below the cover glass 210. The high-reflective layer 240 may reflect light introduced from outside. Specifically, when the flexible display device 100 is disposed in the second state, the high-reflective layer 240 may reflect light introduced from outside so that the inner portion of the second body 102 is not visible from the outside.

Specifically, (a) of FIG. 6 illustrates a state in which light is introduced from the outside to the rear surface of the second body 102 of the flexible display device 100 disposed in the second state. Here, light introduced from the outside is reflected by the high-reflective layer 240. As a result, a possibility of a user visually recognizing inside of the second body 102 can be reduced.

As such, the high-reflective layer 240 may include titanium dioxide (TiO2), silicon dioxide (SiO2) and metal oxide (MOx) to reflect light entering from the outside.

Titanium dioxide (TiO2) is oxidized titanium which is a transition metal, and it has an effect of blocking ultraviolet rays and exhibits anisotropy with a very high refractive index. In addition, since titanium dioxide has a high scattering property, it can easily reflect light.

Silicon dioxide (SiO2) is a silicon oxide, silicic anhydride or silica, which has light scattering and absorbing properties.

Metal oxide (MOx) is a material in which various metals are oxidized, and it can easily reflect light due to the property of metal which is easily scattering light. Since metal is mixed to improve reflectance, aluminum (Al) or tin (Sn) can be mixed therein. Since conductivity may increase as a proportion of a metal to be mixed is increased, it is preferable to mix it by 1 to 5% by weight.

Therefore, the high-reflective layer 240 may prevent the inner portion of the second body 102 from showing by absorbing light introduced from outside or by reflecting and scattering light with the above-described material. Meanwhile, the high-reflective layer 240 may not include all the titanium dioxide ($TiO_2$), silicon dioxide ($SiO_2$), and metal oxide ($MO_x$), but may include at least one of them.

(b) of FIG. 6 is a view illustrating light from the flexible display 151 disposed on the rear surface of the second body 102 of the flexible display device 100 in the first state. Here, light from the flexible display 151 may pass through the high-reflective layer 240 and exit the flexible display device 100.

That is, in the first state, light from the flexible display 151 may pass through the high-reflective layer 240, and the light can be viewed from outside. In addition, in the second state, light introduced into the rear surface of the second body 102 may be reflected by the high-reflective layer 240.

The low-reflective layer 260 is disposed below the high-reflective layer 240. The low-reflective layer 260 may absorb light passed through the high-reflective layer 240. Specifically, the low-reflective layer 260 may be made of black tint (BK tint). The low-reflective layer 260 may form a coated layer. Various color expressions of the rear cover glass 200 may be implemented according to types of pigment on the low-reflective layer 260.

In the second state as in (a) of FIG. 6, the low-reflective layer 260 may absorb light coming from the outside. Specifically, when light that is not sufficiently reflected from the high-reflective layer 240 reaches the low-reflective layer 260, the low-reflective layer 260 may absorb the light. Accordingly, it can be reduced that the user visually recognizes the inner portion of the second body 102.

In the first state as in (b) of FIG. 6, the low-reflective layer 260 may pass light from the flexible display 151. Even in the first state, the low-reflective layer 260 may partially absorb the light from the flexible display 151, but most of the light from the flexible display 151 may be transmitted.

Accordingly, in the first state, the user may visually recognize the light from the flexible display 151 through the rear surface of the flexible display device 100, that is, the rear surface of the second body 102. And, in the second state, it is reduced that the user visually recognizes the inner portion of the rear surface of the second body 102.

The adhesive layers 220 and 250 may be disposed on at least one place between the cover glass 210 and the high-reflective layer 240 or between the high-reflective layer 240 and the low-reflective layer 260. That is, two or more of the adhesive layers 220 and 250 may be provided. Specifically, as illustrated in (a) and (b) of FIG. 6, a first adhesive layer 220 is interposed between the cover glass 210 and the high-reflective layer 240 and bond them together. In addition, a second adhesive layer 250 is interposed between the high-reflective layer 240 and the low-reflective layer 260 and bond them together.

For the adhesive layers 220 and 250, adhesives or adhesive tapes such as optical clear adhesive (OCA) and optical clear resin (OCR) may be used.

The PET film 230 (PolyEthylene Terephthalate Film) may be disposed above or below the high-reflective layer 240. When the rear cover glass 200 is damaged, the PET film 230 may serve as a shatter proof film to prevent shattering of components.

Meanwhile, a bezel area 270 may be printed below the low-reflective layer 260.

Specifically, a material having a color same or similar to that of the bezel of the second body 102 needs to be printed in an area where the flexible display 151 is not disposed in the second body 102 so that the inner portion of the second body 102 is not visible. Such a bezel area 270 may be printed with a pigment.

The bezel area 270 has an effect of increasing a consistency of the second body 102 and the rear cover glass 200.

Between the bezel areas 270 is a viewing area 275 that allows light from the flexible display 151 to be transmitted to outside.

Hereinafter, thickness of each layer constituting the rear cover glass 200 will be described.

A thickness of the low-reflective layer 260 may be formed thinner than the adhesive layer and the PET film 230.

Specifically, referring to FIG. 6, the thickness of the low-reflective layer 260 may be about 3 to 4 μm. And a thickness of the adhesive layer may be about 50 μm. Since the low-reflective layer 260 absorbs light, when it is formed thicker than 3 to 4 μm, visibility of light emitted from the flexible display 151 may be deteriorated. In addition, when the low-reflective layer 260 is formed thinner than 3 to 4 μm, the rear surface of the second body 102 may be visible in the second state.

A thickness of the high-reflective layer 240 may be formed thinner than the low-reflective layer 260. Specifically, referring to FIG. 6, the thickness of the high-reflective layer 240 may be about 50 to 200 nm. Since the high-reflective layer 240 has a strong light reflecting property, when the high-reflective layer 240 is thicker than 200 nm, scattering of light from the flexible display 151 in the first state may increase, thereby deteriorating user's visibility. In addition, when the high-reflective layer 240 is thinner than 50 nm, the scattering property of light introduced from the outside of the second body 102 in the second state is lowered and the inner portion of the second body 102 can be visually recognized from the outside.

Meanwhile, the PET film 230 may have a thickness of about 50 μm. In addition, the bezel area 270 preferably has a thickness of about 6 to 8 μm. This will be described later in detail.

The rear cover glass 200 transmits light from the flexible display 151 when power is applied to the flexible display 151 in the first state. Accordingly, the user can visually recognize visual information displayed on the flexible display 151.

In addition, the rear cover glass 200 can reduce showing of the inner portion of the second body 102 in the second state. As described above, the high-reflective layer 240 reflects light introduced from the outside more than a predetermined level, so that the inner portion of the second body 102 is not visible from outside even in the second state in which the flexible display 151 is not covered.

FIG. 7 is a conceptual view illustrating a method for fabricating the rear cover glass 200 according to an embodiment of the present disclosure.

The rear cover glass 200 according to an embodiment of the present disclosure may be disposed on the rear surface of the second body 102 of the flexible display device 100 including the first body, the second body 102 configured to be movable relative to the first body, and the flexible display 151, as described above.

And, the method for fabricating the rear cover glass 200 includes depositing the high-reflective layer 240 on the PET film 230 [S20], adhering the low-reflective layer 260 on the PET film 230 on which the high-reflective layer 240 is deposited [S30], and coating the adhesive layer on the PET film 230 on which the low-reflective layer 260 is adhered [S40].

The method for fabricating the rear cover glass 200 is a method for fabricating several layers to be adhered below the cover glass 210.

First, preparing the PET film 230 [S10] may be included. The PET film 230 may have a desired thickness, for example, 50 μm. The PET film 230 may be fabricated by a film laminating method, which is one of processes for fabricating the rear cover glass 200. For this purpose, the PET film 230 may be disposed between rollers.

In depositing the high-reflective layer 240 on the PET film 230 [S20], the high-reflective layer 240 is disposed on one surface of the PET film 230. At this time, the high-reflective layer 240 may be deposited on the entire PET film 230. Meanwhile, the high-reflective layer may also be deposited on a rear surface of the cover glass.

When performing the deposition, a physical vapor deposition method (PVD), a chemical vapor deposition method (CVD), or the like may be used. However, the deposition methods are not limited thereto. With this deposition process, the high-reflective layer 240 may be deposited thinly on the PET film 230.

After the high-reflective layer 240 is deposited on the PET film 230, adhering the low-reflective layer 260 on the PET film 230 [S30] may be proceeded. The step of adhering the low-reflective layer 260 to the PET film 230 may be performed by the roll-to-roll method passing through two rollers.

Here, a surface on which the high-reflective layer 240 is deposited on the PET film 230 and a surface on which the low-reflective layer 260 is adhered to the PET film 230 may be opposite to each other. That is, unlike illustrated in FIG. 7, the high-reflective layer 240 may be deposited on one surface of the PET film 230 and the low-reflective layer 260 may be adhered to another surface of the PET film 230. This is the same as in the above-described embodiment. The high-reflective layer 240 is disposed on one surface of the PET film 230, and the low-reflective layer 260 is disposed on another surface of the PET film 230.

After the low-reflective layer 260 is adhered, coating the adhesive layer on the PET film 230 [S40] is proceeded. As described in the above embodiment, the adhesive layer may be disposed between the cover glass 210 and the high-reflective layer 240.

In addition, the adhesive layer may also be disposed between the high-reflective layer 240 and the low-reflective layer 260. Therefore, coating the adhesive layer may be performed two or more times. Specifically, after the high-reflective layer 240 is deposited, coating the adhesive layer may be added before the low-reflective layer 260 is adhered. In addition, after the low-reflective layer 260 is adhered to the PET film 230, the adhesive layer may be additionally coated.

After the adhesive layer is coated, cutting and inspecting a plurality of layers of the rear cover glass 200 constituting the rear cover glass 200 [S45] may further be included. In the inspection, transmittance and reflectance of the rear cover glass 200 at different wavelengths may be measured. This will be described in detail below.

Thereafter, printing a black matrix (BM) constituting the bezel area 270 on the low-reflective layer 260 may be further included. The black matrix constituting the bezel area 270 may be formed corresponding to the bezel area 270 provided on the second body 102.

Meanwhile, rest of the process except for the step of depositing the high-reflective layer 240 on the PET film 230 [S20] and the step of printing the black matrix [S50] may be a step of performing an adhesion using a film laminator. Such a method may be referred to as a roll-to-roll method or a film laminator method. In this process, heat may be additionally applied to improve adhesion performance.

In such a roll-to-roll method or a film laminator method, an adhesive layer is added in preparation for the direct deposition or printing method. However, the roll-to-roll method or the film laminator method (yield 88% to 90%) shows a very high yield compared to the direct deposition or printing method (yield 40%). Accordingly, it is possible to fabricate the rear cover glass at a low cost. Further, a fabrication time of the rear cover glass can also be significantly reduced by about 40% compared to the direct deposition method.

FIGS. 8 and 9 are graphs and diagrams showing reflectance and transmittance of a plurality of rear cover glasses having different thicknesses according to an embodiment of the present disclosure at different wavelengths.

Table 1 below shows different rear cover glasses 200 in which each layer thereof has different thickness according to an embodiment of the present disclosure.

TABLE 1

| | | Case A | Case B | Case C |
|---|---|---|---|---|
| Layer | OCA | 25 μm 86 μm ± 7 | 15 μm 76 μm ± 7 | 25 μm 59 μm ± 7 |
| | Transparent Mirror | 50-200 nm | 50-200 nm | 50-200 nm |
| | PET | 50 μm | 50 μm | 25 μm |
| | BK Tint | 3 μm | 3 μm | 3 μm |
| | BM Printing | 8 μm | 8 μm | 8 μm |

Referring to Table 1, the thickness of the high-reflective layer 240 (here, a transparent mirror) is same in Case A, Case B, and Case C, the thickness of the low-reflective layer 260 is same in Case A, Case B, and Case C, and the thickness of the black matrix in the bezel area 270 is same in Case A, Case B, and Case C. The thickness of the high-reflective layer 240 is 50 nm to 200 nm, the thickness of the low-reflective layer 260 is 3 μm, and the thickness of the black matrix is 8 μm.

In Case A, the thickness of the adhesive layer is 25 μm, and the thickness of the PET film 230 is 50 μm. In Case B, the thickness of the adhesive layer is 15 μm, and the thickness of the PET film 230 is 50 μm. In Case C, the thickness of the adhesive layer is 25 μm, and the thickness of the PET film 230 is 25 μm.

Here, the thickness of the adhesive layer in Case B is 15 μm and it is thinner than the thickness in Case A and Case C. The thickness of the PET film 230 in Case C is 25 μm and it is thinner than the thickness in Case A and Case B.

That is, a purpose of Case A, Case B, and Case C is to find out changes in optical properties and others when the thicknesses of the adhesive layer and the PET film 230, not the thicknesses of the high-reflective layer 240 and the low-reflective layer 260, are different. Here, only one adhesive layer is provided above the high-reflective layer 240 in Case A, Case B, and Case C.

(a) and (b) of FIG. 8 show reflectance in Case A, Case B, and Case C at different wavelengths. As described above, light may be reflected mainly on the high-reflective layer 240.

In Case A, Case B, and Case C, the reflectance tends to be reduced as the wavelength of light gets bigger. However, the reflectance is the highest in a vicinity of about 550 nm, which is a middle part of visible light region, in Case A.

In a region where the wavelength of light is 550 nm, the reflectance in Case A is about 20%. However, the thickness of the high-reflective layer is about 50 to 200 nm, and the reflectance may vary from about 20 to 50% depending on the thickness.

In addition, the reflectance in Case B and Case C is about 15%. When reflectance in the region where the wavelength of light is 550 nm is decreased, light introduced into the rear surface of the second body 102 in the second state is not sufficiently reflected, so that the user can view the inside of the rear surface of the second body 102. Therefore, for reflectance, it can be determined that Case A is the most suitable.

(a) and (b) of FIG. 9 show transmittance in Case A, Case B, and Case C at different wavelengths. As described above, light may be absorbed mainly in the low-reflective layer 260.

In case A, case B, and case C, the transmittance increases as the wavelength of light gets bigger. However, the transmittance is the lowest in the vicinity of about 550 nm, which is the middle part of visible light region, in Case A.

In the region where the wavelength of light is 550 nm, the transmittance in Case A is about 10%. And, the transmittance in Case B is about 11%. In addition, the transmittance in Case C is about 11 to 12.5%. When transmittance in the region where the wavelength of light is 550 nm is increased, light introduced into the rear surface of the second body 102 in the second state is not sufficiently absorbed, so that the user can view the inside of the rear surface of the second body 102. Therefore, for absorption rate also, it can be determined that Case A is the most suitable.

That is, in considering reflectance and transmittance in the visible light regions in Case A, Case B, and Case C in which the thickness of the adhesive layer is different and the thickness of the PET film 230 is different in each cases, and accordingly a total thickness of the entire layer constituting the rear cover glass 200 is different, it can be seen that it is most preferable to use the adhesive layer and the PET film 230 having same thicknesses as in Case A.

Table 2 below shows reliability and optical characteristics in Case A, Case B, and Case C, respectively.

First, regarding the reliability, the reliability is secured all in high temperature and high humidity, heat-resistant, UV-resistant, and thermal shock in Case A, Case B, and Case C. However, regarding the peel strength, it can be seen that Case A shows 2.06 to 2.1, and thus has higher peel strength than that in Case B and Case C. Here, the peel strength is very low in Case B. In Case C, as the PET film is relatively thin, it is easy to be warped.

Next, regarding the optical properties, in case of ethanol rubbing, Case A, Case B, and Case C all show excellent optical properties, but in color difference, Case B is the lowest, so it shows superiority to Case A and Case C. However, even at this time, it can be seen that Case A, Case B, and Case C are all OK in color difference.

When comparing the transmittance and the reflectance, it can be seen that Case A has a wavelength of 550 nm, or has the lowest transmittance at the wavelength average, and reflectance is higher than that in Case B and Case C.

As described above, it can be seen that when the adhesive layer and the PET film 230 have thicknesses same as in Case A, the peel strength, transmittance, and reflectance are the best, and both reliability and optical properties are excellently satisfied.

The aforementioned flexible display device and the case thereof are not limited to the configurations and the methods of the embodiments described above, but all or some of the embodiments may be selectively combined so that various modifications can be implemented.

What is claimed is:

1. A flexible display device comprising:
    a first body;
    a second body configured to be movable relative to the first body;
    a flexible display disposed on a front surface of the first body and a rear surface of the second body, and configured such that a size of an area exposed to the front surface of the first body and a size of an area exposed to the rear surface of the second body vary as the second body is moved relative to the first body; and
    a rear cover glass mounted on the second body and disposed to cover at least a part of the rear surface of the second body,

TABLE 2

|  |  | Case A | Case B | Case C |
|---|---|---|---|---|
| Reliability (single item) | Peel Strength (>1.2 Kgf/cm2) | OK (2.06-2.1) | OK (1.7-1.8) | OK (1.7-1.8) |
|  | High temperature and high humidity (70° C., 90% × 72 hr) | OK | OK | OK |
|  | Heat-resistant (100° C. × 1 hr) | OK (100/100) | OK (100/100) | OK (100/100) |
|  | UV-resistant (ΔE < 2.3) | OK (0.1-0.2) | OK (0.3-0.7) | OK (0.1-0.2) |
|  | Thermal shock (−40° C. to 80° C., 12 cycles) | OK (100/100) | OK (100/100) | OK (100/100) |
| Optical characteristics | Ethanol rubbing (500 g × 100 times) | OK | OK | OK |
|  | Transmittance/reflectance (%, based on 550 nm) | 10.1/19.6 | 11.3/14.9 | 11.8/14.9 |
|  | Transmittance/reflectance (%, wavelength average) | 14.5/20.6 | 16.2/15.0 | 17.3/15 |
|  | Color difference (ΔE < 1.0) | OK (0.2-0.5) | OK (0.1-0.3) | OK (0.3-0.7) | wherein the flexible display is capable of being implemented in:

a first state in which the first body and the second body are located adjacent to each other such that the size of the area exposed to the rear surface of the second body increases, and a second state in which the first body and the second body move away from each other such that the size of the area exposed to the front surface of the first body increases, wherein the rear cover glass is configured to:

cover the flexible display disposed on the rear surface of the second body in the first state; and cover an inner portion of the second body located at an inner surface of the second body in the second state, and wherein the rear cover glass comprises a high-reflective layer configured to:

transmit light from the flexible display, when power is applied to the flexible display in the first state; and reflect light introduced from outside to reduce visibility of the inner portion of the second body in the second state.

2. The flexible display device of claim 1, wherein the high-reflective layer comprises:

titanium dioxide ($TiO_2$), silicon dioxide ($SiO_2$), and metal oxide ($MO_x$).

3. A flexible display device comprising:

a first body;

a second body configured to be movable relative to the first body;

a flexible display disposed on a front surface of the first body and a rear surface of the second body, and configured such that a size of an area exposed to the front surface of the first body and a size of an area exposed to the rear surface of the second body vary as the second body is moved relative to the first body; and a rear cover glass mounted on the second body and disposed to cover at least a part of the rear surface of the second body, wherein the rear cover glass comprises:

a cover glass located on an outermost portion;

a high-reflective layer disposed below the cover glass to reflect light introduced from outside; and a low-reflective layer disposed below the high-reflective layer to absorb light that is introduced from outside and passes through the high-reflective layer.

4. The flexible display device of claim 3, wherein the rear cover glass further comprises:

an adhesive layer disposed at at least one area between the cover glass and the high-reflective layer or between the high-reflective layer and the low-reflective layer.

5. The flexible display device of claim 4, wherein the rear cover glass further comprises:

a poly ethylene terephthalate (PET) film disposed above or below the high-reflective layer.

6. The flexible display device of claim 5, wherein the low-reflective layer is formed thinner than the adhesive layer and the PET film, and the high-reflective layer is formed thinner than the low-reflective layer.

7. The flexible display device of claim 3, wherein a bezel area is printed below the low-reflective layer.

8. The flexible display device of claim 3, wherein the second body is bent at an end portion thereof, and the rear cover glass is bent at an end portion thereof along the bent end portion of the second body.

* * * * *